(12) United States Patent
 Kotani

(10) Patent No.: US 11,329,614 B2
(45) Date of Patent: May 10, 2022

(54) HIGH-FREQUENCY POWER SUPPLY CIRCUIT AND DETERMINING METHOD OF CONSTANTS OF AMPLIFIER CIRCUIT

(71) Applicant: DAIHEN Corporation, Osaka (JP)

(72) Inventor: Hiroyuki Kotani, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 17/004,405

(22) Filed: Aug. 27, 2020

(65) Prior Publication Data

US 2021/0111676 A1 Apr. 15, 2021

(30) Foreign Application Priority Data

Oct. 11, 2019 (JP) .............................. JP2019-188088

(51) Int. Cl.
*H03F 1/56* (2006.01)
*H03F 3/72* (2006.01)
*H03F 3/217* (2006.01)
*H02M 1/12* (2006.01)
*H03F 3/19* (2006.01)

(52) U.S. Cl.
CPC .............. *H03F 1/565* (2013.01); *H02M 1/12* (2013.01); *H03F 3/19* (2013.01); *H03F 3/2178* (2013.01); *H03F 3/72* (2013.01); *H03F 2200/451* (2013.01)

(58) Field of Classification Search
CPC .......... H03F 1/565; H03F 3/19; H03F 3/2178; H03F 3/72; H03F 2200/451; H02M 1/12
USPC ........................................................ 330/302
See application file for complete search history.

(56) References Cited

U.S. PATENT DOCUMENTS

| | | | |
|---|---|---|---|
| 7,251,121 B2 | 7/2007 | Bhutta | |
| 7,298,128 B2 | 11/2007 | Bhutta | |
| 9,196,459 B2 | 11/2015 | Bhutta | |
| 9,306,533 B1 | 4/2016 | Mavretic | |
| 9,345,122 B2 | 5/2016 | Bhutta | |
| 9,496,122 B1 | 11/2016 | Bhutta | |
| 9,525,412 B2 | 12/2016 | Mavretic | |
| 9,543,122 B2 | 1/2017 | Bhutta | |
| 9,584,090 B2 | 2/2017 | Mavretic | |
| 9,591,739 B2 | 3/2017 | Bhutta | |
| 9,697,991 B2 | 7/2017 | Bhutta | |
| 9,728,378 B2 | 8/2017 | Bhutta et al. | |

(Continued)

FOREIGN PATENT DOCUMENTS

JP 2016-004745 A 1/2016
WO WO2015097812 A1 7/2015

*Primary Examiner* — Hafizur Rahman
(74) *Attorney, Agent, or Firm* — Bret E. Field; Bozicevic, Field & Francis LLP

(57) ABSTRACT

A high-frequency power supply circuit includes an amplifier circuit. In the amplifier circuit, one end of an inductor is connected to a direct-current power supply. One end of a switching element is connected to the other end of the inductor. A parallel capacitor is connected in parallel to the switching element. One end of an LC series circuit is connected to the one end of the switching element. A circuit capacitor is connected between the other end of the LC series circuit and the other end of the switching element. The amplifier circuit amplifies a signal having a unique frequency input to a control terminal of the switching element. The amplifier circuit outputs, to a load, a current having the frequency from a connection point between the other end of the LC series circuit and the circuit capacitor.

5 Claims, 7 Drawing Sheets

(56) References Cited

U.S. PATENT DOCUMENTS

| | | |
|---|---|---|
| 9,729,122 B2 | 8/2017 | Mavretic |
| 9,745,660 B2 | 8/2017 | Bhutta |
| 9,755,641 B1 | 9/2017 | Bhutta |
| 9,844,127 B2 | 12/2017 | Bhutta |
| 9,865,432 B1 | 1/2018 | Bhutta |
| 10,026,594 B2 | 7/2018 | Bhutta |
| 10,217,608 B2 | 2/2019 | Mavretic |
| 10,340,879 B2 | 7/2019 | Mavretic et al. |
| 10,431,424 B2 | 10/2019 | Mavretic et al. |
| 10,431,428 B2 | 10/2019 | Bhutta et al. |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 | 11/2019 | Bhutta et al. |
| 10,727,029 B2 | 7/2020 | Ulrich et al. |
| 2016/0065207 A1 | 3/2016 | Bhutta |
| 2016/0380610 A1 | 12/2016 | Ulrich |
| 2017/0129347 A1* | 5/2017 | Kotani ................. B60L 53/122 |
| 2017/0178865 A1 | 6/2017 | Ulrich |
| 2018/0076788 A1 | 3/2018 | Decker et al. |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |
| 2020/0035461 A1 | 1/2020 | Bhutta et al. |

\* cited by examiner

F I G. 1
100
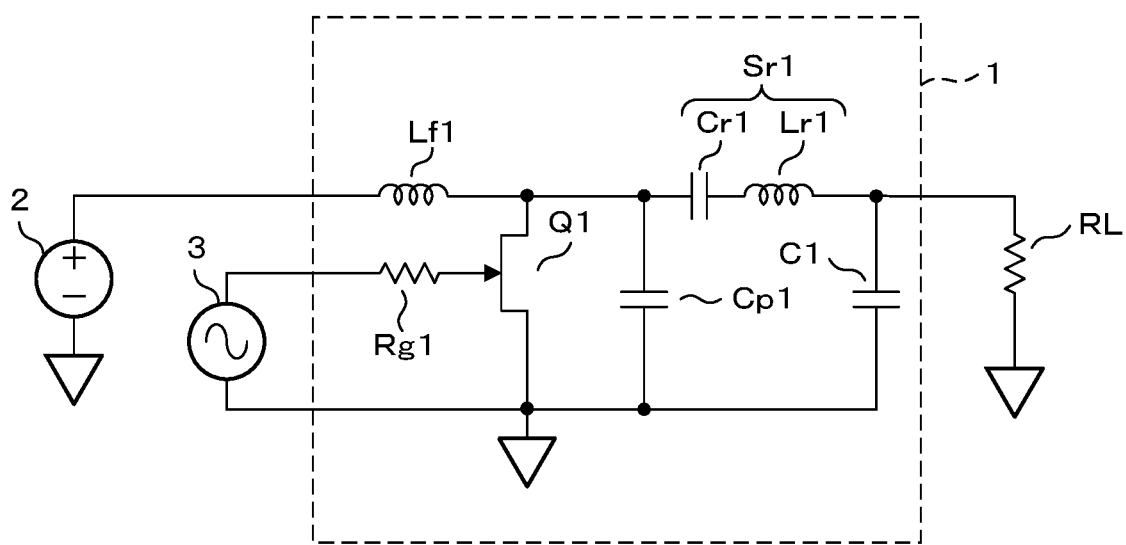

HIGH-FREQUENCY POWER SUPPLY CIRCUIT AND DETERMINING METHOD OF CONSTANTS OF AMPLIFIER CIRCUIT

CROSS-REFERENCE TO RELATED APPLICATION

This Nonprovisional application claims priority under 35 U.S.C. § 119(a) on Patent Application No. 2019-188088 filed in Japan on Oct. 11, 2019, the entire contents of which are hereby incorporated by reference.

FIELD

The present disclosure relates to a high-frequency power supply circuit and a determining method of constants of an amplifier circuit.

BACKGROUND

In the related art, when the output level of high-frequency power is changed in a high-frequency power supply circuit using a switching amplifier, it is necessary to perform any one of the following methods. A first method combines the high-frequency powers of two switching amplifiers with a phase difference corresponding to the output level. A second method changes a power supply voltage of the switching amplifier. In the second method, there is a limit to a response speed and the range of change in the output level according to the change in the power supply voltage.

For example, International Publication No. 2015/097812 discloses a technique in which two high-frequency powers output from a class-E type power supply circuit using two switching amplifiers are combined by a transformer. A phase difference control circuit controls a phase difference between two voltage signals according to the magnitude of transmission power. In the two switching amplifiers, two power elements perform switching operations. The two voltage signals are input to gate terminals (G terminals) of the two power elements through a high-frequency pulse drive circuit.

Japanese Patent Laid-Open Publication No. 2016-4745 discloses a high-frequency power supply that combines the high-frequency output powers of two DC-RF conversion units in a hybrid manner. In the high-frequency power supply, a DC-DC conversion unit is a power supply for the DC-RF conversion unit. In a case in which the direct-current output power of the DC-DC conversion unit is less than a switching threshold value, a phase difference between the output voltages of the two DC-RF conversion units is changed to control the magnitude of the high-frequency output power.

In a case in which the direct-current output power is equal to or greater than the switching threshold value, in the method for changing the phase difference between the output voltages of the two DC-RF conversion units, the loss of a resistor in the hybrid increases and the efficiency of DC-RF conversion is reduced. Therefore, in a case in which the direct-current output power is equal to or greater than the switching threshold value, the output voltages of the two DC-RF conversion units are changed to control the magnitude of the high-frequency output power.

SUMMARY

However, according to the techniques disclosed in International Publication No. 2015/097812 and Japanese Patent Laid-Open Publication No. 2016-4745, the outputs of the class-E type power supply circuit and the DC-RF conversion unit have a constant voltage characteristic. Therefore, a transformer or a hybrid is required when combining two high-frequency powers. For this reason, the techniques have a problem that a circuit scale or cost is increased and high-frequency power is lost.

The present disclosure has been made in view of the above-mentioned problems and an object of the present disclosure is to provide a high-frequency power supply circuit and a determining method of constants of an amplifier circuit that can achieve an output of a current regardless of the state of an output destination.

A high-frequency power supply circuit according to an aspect of the present disclosure includes an amplifier circuit. The amplifier circuit includes: an inductor that has one end connected to a direct-current power supply; a switching element that has one end connected to the other end of the inductor; a parallel capacitor that is connected in parallel to the switching element; an LC series circuit that has one end connected to the one end of the switching element; and a circuit capacitor that is connected between the other end of the LC series circuit and the other end of the switching element. The amplifier circuit amplifies a signal which has a unique frequency and which is input to a control terminal of the switching element. The amplifier circuit outputs, to a load, a current having the unique frequency from a connection point between the other end of the LC series circuit and the circuit capacitor.

In this aspect, one end of the inductor is connected to the direct-current power supply. A parallel circuit is configured by the switching element and the parallel capacitor. One end of the parallel circuit and one end of the LC series circuit are connected to the other end of the inductor. The circuit capacitor is connected between the other end of the LC series circuit and the other end of the parallel circuit. The load is connected in parallel to the circuit capacitor. A signal having a unique frequency is input to the control terminal of the switching element. The amplifier circuit amplifies the signal having the unique frequency and outputs a current having the same frequency as the unique frequency to the load. That is, the load is connected to an output terminal of a circuit similar to a so-called class-E amplifier circuit. The circuit capacitor is connected in parallel to the load. Some circuit constants are appropriately adjusted to increase output impedance.

In a high-frequency power supply circuit according to an aspect of the present disclosure, an absolute value of first impedance of a case in which the amplifier circuit side is viewed from the load is greater than impedance of the load when the switching element is ON, the first impedance being related to the unique frequency.

In this aspect, the absolute value of the first impedance of the case in which the output side of the amplifier circuit is viewed from the load is greater than the impedance of the load in a state in which the switching element is ON, the first impedance being related to the unique frequency. Therefore, the output of the high-frequency power supply circuit has a constant current characteristic.

In a high-frequency power supply circuit according to an aspect of the present disclosure, a reactance component of second impedance of a case in which the load side is viewed from the one end of the LC series circuit is inductive, the second impedance being related to the unique frequency.

In this aspect, the reactance component of the impedance of the case in which the load side is viewed from the one end of the LC series circuit through the LC series circuit is inductive, the second impedance being related to the unique frequency. Therefore, the soft switching of the switching element can be achieved by the interaction between the switching element and the parallel capacitor connected in parallel.

A high-frequency power supply circuit according to an aspect of the present disclosure further includes two assembled circuits. Each assembled circuit includes one or a plurality of the amplifier circuits. The other ends of a plurality of the LC series circuits included in the two assembled circuits are connected to each other.

In this aspect, an assembled circuit is achieved by putting one or a plurality of amplifier circuits together. The output ends of all of the amplifier circuits are connected each other in order to put two assembled circuits together. Therefore, the currents output from one or a plurality of the amplifier circuits are added in each assembled circuit. In addition, the currents output from two assembled circuit are added.

A high-frequency power supply circuit according to an aspect of the present disclosure further includes two signal generators that correspond to the two assembled circuits, respectively. Each signal generator inputs the signal having the unique frequency to the control terminal of the switching element included in the amplifier circuit of the corresponding assembled circuit. A phase difference between the signals output by the two signal generators is variable.

In this aspect, each assembled circuit includes one or a plurality of amplifier circuits. The signal generator is independently provided for each assembled circuit. Each signal generator inputs the signal having the unique frequency to the control terminal of one or a plurality of amplifier circuits in the corresponding assembled circuit. The phase difference between the signals generated by the two signal generators is variably controlled. Therefore, a current, amplitude of which is variably adjusted according to the phase difference, can be output from the circuit in which the assembled circuits are connected to each other.

In a determining method of constants of an amplifier circuit according to an aspect of the present disclosure, the circuit constants of the amplifier circuit are determined. The amplifier circuit includes: a first inductor; a switching element that has one end connected to one end of the first inductor; a first capacitor that is connected in parallel to the switching element; an LC series circuit that has one end connected to the one end of the switching element and includes a second capacitor and a second inductor; and a third capacitor that is connected between the other end of the LC series circuit and the other end of the switching element. The determining method includes: determining inductance of the first and second inductors and capacitance of the first and second capacitors such that a circuit excluding the third capacitor becomes a class-E amplifier circuit that amplifies a signal having a unique frequency; adjusting the determined inductance of the second inductor to a larger value such that a resistance component of impedance of a case in which the amplifier circuit side is viewed from a connection point between the other end of the LC series circuit and the third capacitor approaches infinity and a reactance component of the impedance approaches 0 when the switching element is ON in a circuit including the third capacitor, the impedance being related to the unique frequency; and adjusting the capacitance of the third capacitor such that the resistance component approaches infinity and the reactance component approaches 0 when the switching element is ON in the circuit including the third capacitor.

In this aspect, one end of the first inductor is connected to the direct-current power supply. A parallel circuit is configured by the switching element and the first capacitor. The other end of the first inductor is connected to one end of the parallel circuit and one end of the LC series circuit including the second capacitor and the second inductor. The third capacitor is connected between the other end of the LC series circuit and the other end of the parallel circuit. The load is connected in parallel to the third capacitor. First, circuit constants are determined such that a circuit configured by excluding the third capacitor from this configuration becomes a class-E amplifier circuit that amplifies a signal including the unique frequency. Then, the inductance of the second inductor is adjusted to a larger value and the capacitance of the third capacitor is adjusted such that the following condition is satisfied in a state in which the switching element is ON in a circuit including the third capacitor. This condition is that a resistance component of the impedance of the case in which the output side of the amplifier circuit is viewed from the load approaches infinity and a reactance component approaches 0, the impedance being related to the unique frequency. The inductance and the capacitance are adjusted to achieve the configuration in which the amplifier circuit that outputs high-frequency power with a unique frequency has a constant current characteristic.

According to the present disclosure, it is possible to achieve an output of a current regardless of the state of an output destination.

The above and further objects and features will move fully be apparent from the following detailed description with accompanying drawings.

BRIEF DESCRIPTION OF THE DRAWINGS

FIG. 1 is a block diagram illustrating an example of the configuration of a high-frequency power supply circuit according to Embodiment 1.

DETAILED DESCRIPTION OF NON-LIMITING EXAMPLE EMBODIMENTS

Figure 2:
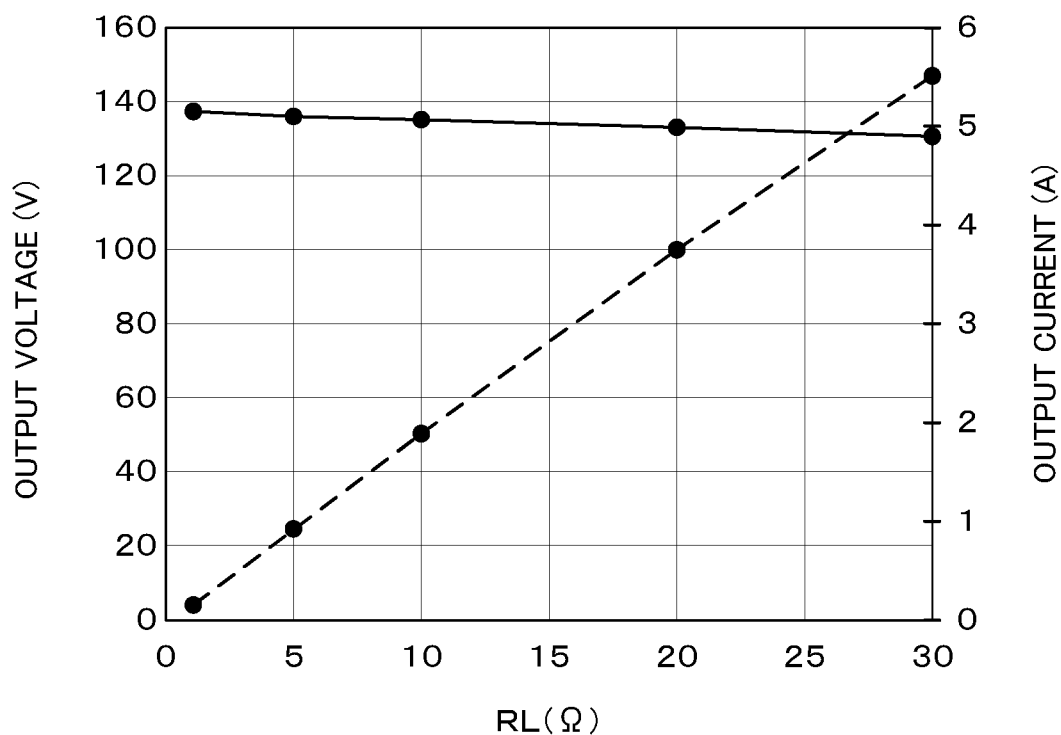
FIG. 2 is a graph showing the output characteristics of an amplifier circuit, circuit constants of which have been adjusted.

Hereinafter, the present disclosure will be described in detail with reference to the drawings illustrating embodiments.

Embodiment 1

FIG. 1 is a block diagram illustrating an example of the configuration of a high-frequency power supply circuit 100 according to Embodiment 1. The high-frequency power supply circuit 100 includes an amplifier circuit 1. The amplifier circuit 1 amplifies a signal having a unique frequency which is unique to the amplifier circuit 1. In a case in which the signal having the unique frequency is input from a signal generator 3 in a state in which a current is supplied from a direct-current power supply 2 to the amplifier circuit 1, the current of the signal amplified by the amplifier circuit 1 is output to a load RL. In Embodiment 1, the unique frequency is 40.68 MHz. However, the unique frequency is not limited to 40.68 MHz and may be, for example, a frequency in an industrial radio frequency (RF) band. The frequency in the industrial RF band is 2 MHz, 13.56 MHz, 27 MHz, 60 MHz, or the like. In a case in which the values of circuit constants of the amplifier circuit 1 are determined so as to be suitable for a specific frequency among these frequencies, the specific frequency is the unique frequency.

The amplifier circuit 1 includes an inductor Lf1, a transistor (GaN-FET; gallium nitride-field effect transistor) Q1, and a capacitor Cp1. One end of the inductor Lf1 is connected to the direct-current power supply 2. A drain of the transistor Q1 is connected to the other end of the inductor Lf1. The capacitor Cp1 is connected in parallel to the transistor Q1 between the drain and source of the transistor Q1. The transistor Q1 may be, for example, a GaN-HEMT (high electron mobility transistor). The inductor Lf1 corresponds to a first inductor. The transistor Q1 corresponds to a switching element. The capacitor Cp1 corresponds to a parallel capacitor and a first capacitor.

The amplifier circuit 1 further includes an LC series circuit Sr1 and a capacitor C1. In the LC series circuit Sr1, a capacitor Cr1 is connected in series to an inductor Lr1. One end of the LC series circuit Sr1 is connected to the drain of the transistor Q1. The capacitor C1 is connected between the other end of the LC series circuit Sr1 and the source of the transistor Q1. In FIG. 1, the capacitor Cr1 is connected to the drain of the transistor Q1. However, the inductor Lr1 may be connected to the drain of the transistor Q1. A white inverted triangle in FIG. 1 indicates a common potential. A connection point between the source of the transistor Q1 and the capacitor Cp1 is connected to the common potential. The capacitor Cr1 corresponds to a second capacitor. The inductor Lr1 corresponds to a second inductor. The capacitor C1 corresponds to a circuit capacitor and a third capacitor.

The direct-current power supply 2 is a constant voltage power supply. The direct-current power supply 2 outputs a direct-current voltage of 100 V and supplies a direct current from one end of the inductor Lf1. It is noted that the output voltage of the direct-current power supply 2 is not limited to 100 V.

The signal generator 3 inputs a high-frequency signal having 40.68 MHz between the gate and source of the transistor Q1 through a resistor Rg1. The signal generator 3 includes a driver that drives the gate of the transistor Q1. The gate of the transistor Q1 corresponds to a control terminal.

The load RL includes, for example, a plasma processing apparatus and an impedance matching device that is connected in parallel to the plasma processing apparatus. The load RL is preferably a device that is regarded as having a reactance component of 0 even when a resistance component of impedance changes.

Next, a method for determining the circuit constants of the amplifier circuit 1 will be described. A circuit configured by excluding the capacitor C1 from the amplifier circuit 1 has the same circuit configuration as a so-called class-E amplifier circuit. Some of the circuit constants of the circuit configured by excluding the capacitor C1 from the amplifier circuit 1 are different from those of the class-E amplifier circuit. Here, the class-E amplifier circuit is a high-efficiency amplifier circuit that performs zero voltage switching (ZVS) which is a kind of soft switching to reduce the switching loss of a switching element. In a ZVS operation, the transistor Q1 is turned on while a drain voltage of the transistor Q1 is 0 V. Therefore, at least turn-on loss is reduced.

In a case in which the circuit constant of the resistor Rg1 is excluded, the number of circuit constants of the amplifier circuit 1 is 5. In this case, flexibility in determining the constants is too high. Therefore, first, temporary circuit constants are determined such that the circuit excluding the capacitor C1 becomes a class-E amplifier circuit. Then, in the circuit including the capacitor C1, the inductance of the inductor Lr1 is adjusted to a value greater than the temporary inductance of the inductor Lr1. Therefore, the inductance of the inductor Lr1 is adjusted to target inductance. Furthermore, the capacitance of the capacitor C1 is adjusted. In a case in which the temporary circuit constants are calculated by simulation, the value of each circuit constant is determined as follows, for example. It is noted that the combinations of the circuit constants are not limited to the combinations of the determined circuit constants. The unique frequency is set to 40.68 MHz. The resistance value of the register Rg1 is set to 0.1Ω. However, the resistance value of the register Rg1 may be a resistance value different from 0.1 Ω.

$$Lf1=57\ nH, Cp1=100\ pF, Cr1=39\ pF, Lr1=386\ nH$$

In many cases, the output impedance of the class-E amplifier circuit achieved by the determined circuit constants is sufficiently lower than the impedance of the general load RL. In a case in which the output impedance is sufficiently low, when the class-E amplifier circuit is used as the high-frequency power supply, the output of the high-frequency power supply has a constant voltage characteristic. In practice, impedance Z of a case in which the output side of the amplifier circuit, circuit constants of which have been determined as described above, is viewed from the load RL is (0.30−j1.66)Ω. In a case in which the output of the high-frequency power supply has a constant voltage characteristic, only the connection between the outputs of a plurality of high-frequency power supplies is insufficient to achieve the addition of the output currents. Therefore, in Embodiment 1, a kind of impedance conversion circuit is inserted between the load RL and the output of the class-E amplifier circuit achieved by the circuit configured by excluding the capacitor C1 from the amplifier circuit 1. Even in a case in which the class-E amplifier circuit achieved by the temporary circuit constant does not have the constant voltage characteristic, the conversion circuit can be inserted similarly to change the output characteristics of the amplifier circuit 1.

Specifically, another inductor is inserted between the load RL and the inductor Lr1, temporary inductance of which has been determined as a portion of the class-E amplifier circuit. Another capacitor is added between the common potential and a connection point between the inserted inductor and the load RL. Then, the inductance of the inserted inductor is added to the temporary inductance of the inductor Lr1 and the added capacitor is used as the capacitor C1. Therefore, the target inductance of the inductor Lr1 of the amplifier circuit 1 is higher than the temporary inductance of the inductor Lr1 included in the class-E amplifier circuit.

More specifically, the insertion of another inductor and the addition of another capacitor are performed to adjust the impedance of a case in which the output side of the amplifier circuit 1 is viewed from the load RL such that a resistance component approaches infinity and a reactance component approaches 0, the impedance being related to the unique frequency. In other words, the inductance of the inductor Lr1 and the capacitance of the capacitor C1 are adjusted such that the impedance of the case in which the output side of the amplifier circuit 1 is viewed from the load RL approaches the outer circumference of a circle on the Smith chart and approaches the real axis, the impedance being related to the unique frequency. It is preferable that the absolute value of the adjusted impedance is sufficiently greater than the impedance of the load RL.

In addition to the above-mentioned adjustment, adjustment is performed such that a reactance component of the impedance of a case in which the load RL side is viewed from one end of the LC series circuit Sr1 is inductive. Here, the one end of the LC series circuit Sr1 is one end of the capacitor Cr1 connected to the transistor Q1. As a result of this adjustment, an oscillating voltage is generated at the drain of the transistor Q1 by the interaction between the capacitive reactance of the capacitor Cp1 and the inductive reactance of the impedance of a case in which the load RL side is viewed from one end of the LC series circuit Sr1. This enables the ZVS operation of the transistor Q1. In a case in which the adjustment is performed as described above, the circuit constants of the inductor Lr1 and the capacitor C1 and the impedance Z are represented as follows (a) to (c), for example. The impedance Z is impedance of a case in which the output side of the amplifier circuit 1 is viewed from the load RL.

$$Lr1=486 \text{ nH}, C1=163 \text{ pF}, Z=(1.9 \text{ k}+j43)\Omega \quad (a)$$

$$Lr1=460 \text{ nH}, C1=226 \text{ pF}, Z=(1.0 \text{ k}+j0)\Omega \quad (b)$$

$$Lr1=488 \text{ nH}, C1=160 \text{ pF}, Z=(2.0 \text{ k}+j0)\Omega \quad (c)$$

FIG. 2 is a graph showing the output characteristics of the amplifier circuit 1, circuit constants of which have been adjusted. A combination of the circuit constants is (a). In FIG. 2, the horizontal axis indicates the resistance value (Ω) of the load RL. The vertical axis indicates an output voltage (V) and an output current (A). In FIG. 2, a solid line indicates the output current and a dashed line indicates the output voltage. According to FIG. 2, in a case in which the resistance value of the load RL is changed from 1Ω to 30Ω, the output current is maintained at approximately 5 A. In contrast, in a case in which the resistance value of the load RL is similarly changed, the output voltage linearly increases from 5 V to 148 V. That is, it can be said that the amplifier circuit 1 has a constant current characteristic.

Figure 3:
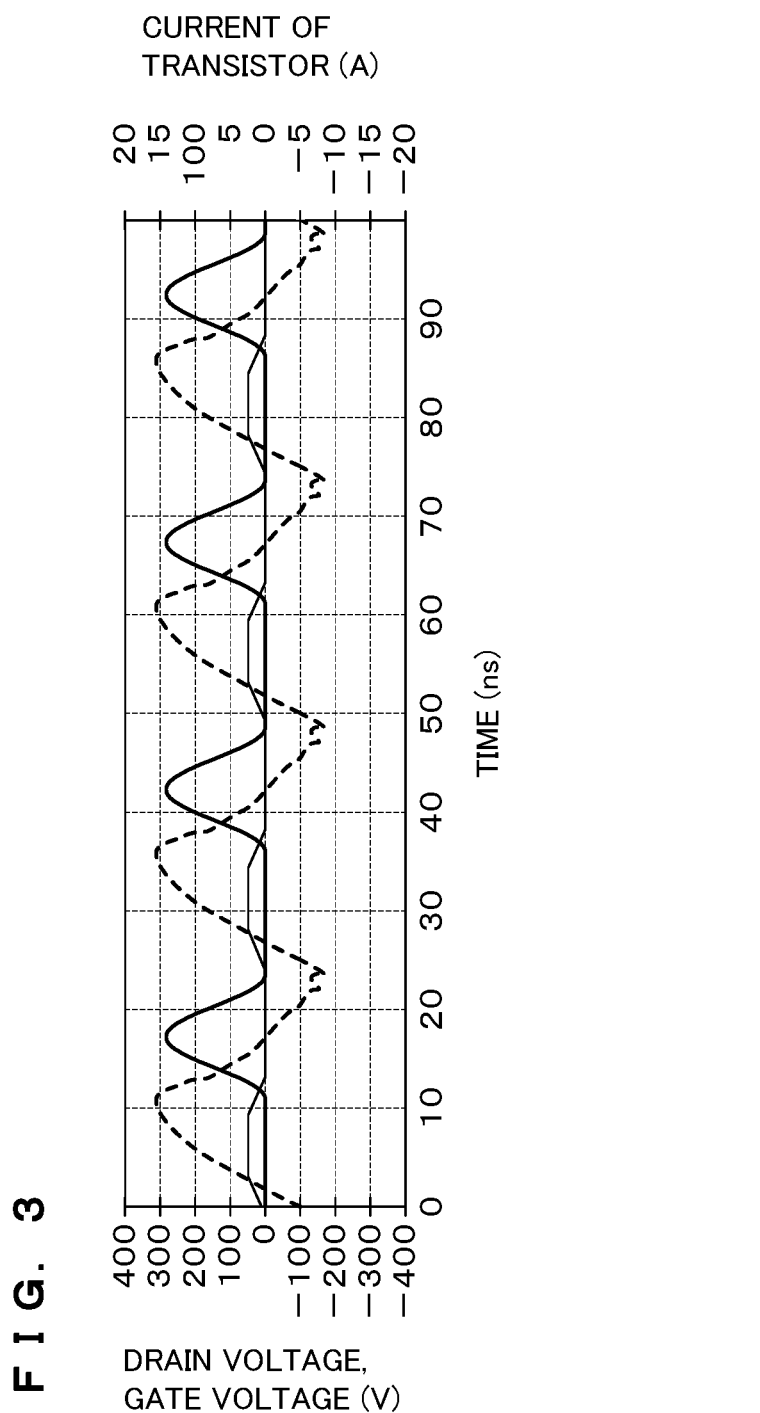
FIG. 3 is a graph showing the waveforms of a voltage and a current of a transistor.

FIG. 3 is a graph showing the waveforms of the voltage and current of the transistor Q1. In FIG. 3, the horizontal axis indicates time (ns) and the vertical axis indicates a drain voltage (V), a gate voltage (V), and the current (A) of the transistor Q1. The current of the transistor Q1 is the drain current of the transistor Q1 and the current of a parasitic diode (not illustrated). In FIG. 3, a thick solid line indicates the drain voltage. A thin solid line indicates the gate voltage. A thick dashed line indicates the current of the transistor Q1. The gate voltage is illustrated on the vertical axis in a scale of 10 times (that is, 10 V/div). According to FIG. 3, it can be said that, while the drain voltage is 0 V, the gate voltage is applied to the transistor Q1 to turn on the transistor Q1 and the ZVS operation is performed.

As described above, according to Embodiment 1, one end of the inductor Lf1 is connected to the direct-current power supply 2. The parallel circuit is configured by the transistor Q1 and the capacitor Cp1. The other end of the inductor Lf1 is connected to one end of the parallel circuit and one end of the LC series circuit Sr1. Further, the capacitor C1 is connected between the other end of the LC series circuit Sr1 and the other end of the parallel circuit. The load RL is connected in parallel to the capacitor C1. In this configuration, when a signal having a unique frequency is input to the gate of the transistor Q1, the amplifier circuit 1 amplifies the signal and outputs a current having the same frequency as the unique frequency to the load RL. That is, the parallel circuit configured by the capacitor C1 and the load RL is connected to an output terminal of a circuit similar to a so-called class-E amplifier circuit. The circuit constants of the capacitor C1 and the inductor Lr1 included in the LC series circuit Sr1 are appropriately adjusted to increase output impedance. Therefore, it is possible to achieve an output of a current regardless of the state of an output destination including the load RL.

According to Embodiment 1, in a state in which the transistor Q1 is ON, the absolute value of the impedance of the case in which the output side of the amplifier circuit 1 is viewed from the load RL is sufficiently greater than the impedance of the load RL, the former impedance being related to the unique frequency. Therefore, the output of the high-frequency power supply circuit 100 has a constant current characteristic.

Further, according to Embodiment 1, a reactance component of the impedance of the case in which the load RL side is viewed from one end of the LC series circuit Sr1 through the LC series circuit Sr1 is inductive, the impedance being related to the unique frequency. Therefore, the soft switching of the transistor Q1 can be achieved by the interaction between the transistor Q1 and the capacitor Cp1 connected in parallel to the transistor Q1.

Furthermore, according to Embodiment 1, the circuit constants of the inductor Lf1, the capacitor Cp1, the inductor Lr1, and the capacitor Cr1 are determined such that the circuit configured by excluding the capacitor C1 from the amplifier circuit 1 becomes a class-E amplifier circuit that amplifies a signal having a unique frequency. Then, the inductance of the inductor Lr1 is adjusted to a larger value and the capacitance of the capacitor C1 is adjusted such that the following condition is satisfied in a state in which the transistor Q1 is ON in the amplifier circuit 1 including the capacitor C1. The condition is that a resistance component of the impedance of the case in which the output side of the amplifier circuit 1 is viewed from the load RL approaches infinity and a reactance component of the impedance approaches 0, the impedance being related to the unique frequency. The adjustment of the inductance and the capacitance makes it possible to achieve a configuration in which the high-frequency power supply circuit 100 that outputs high-frequency power with a unique frequency has a constant current characteristic.

Embodiment 2

In Embodiment 1, the high-frequency power supply circuit 100 includes one amplifier circuit 1. In Embodiment 2, a high-frequency power supply circuit 100a includes two assembled circuits 10. Each assembled circuit 10 includes two amplifier circuits 1. The outputs of four amplifier circuits 1 included in the high-frequency power supply circuit 100a are connected to each other. The number of amplifier circuits 1 included in each assembled circuit 10 may be one or three or more.

Figure 4:
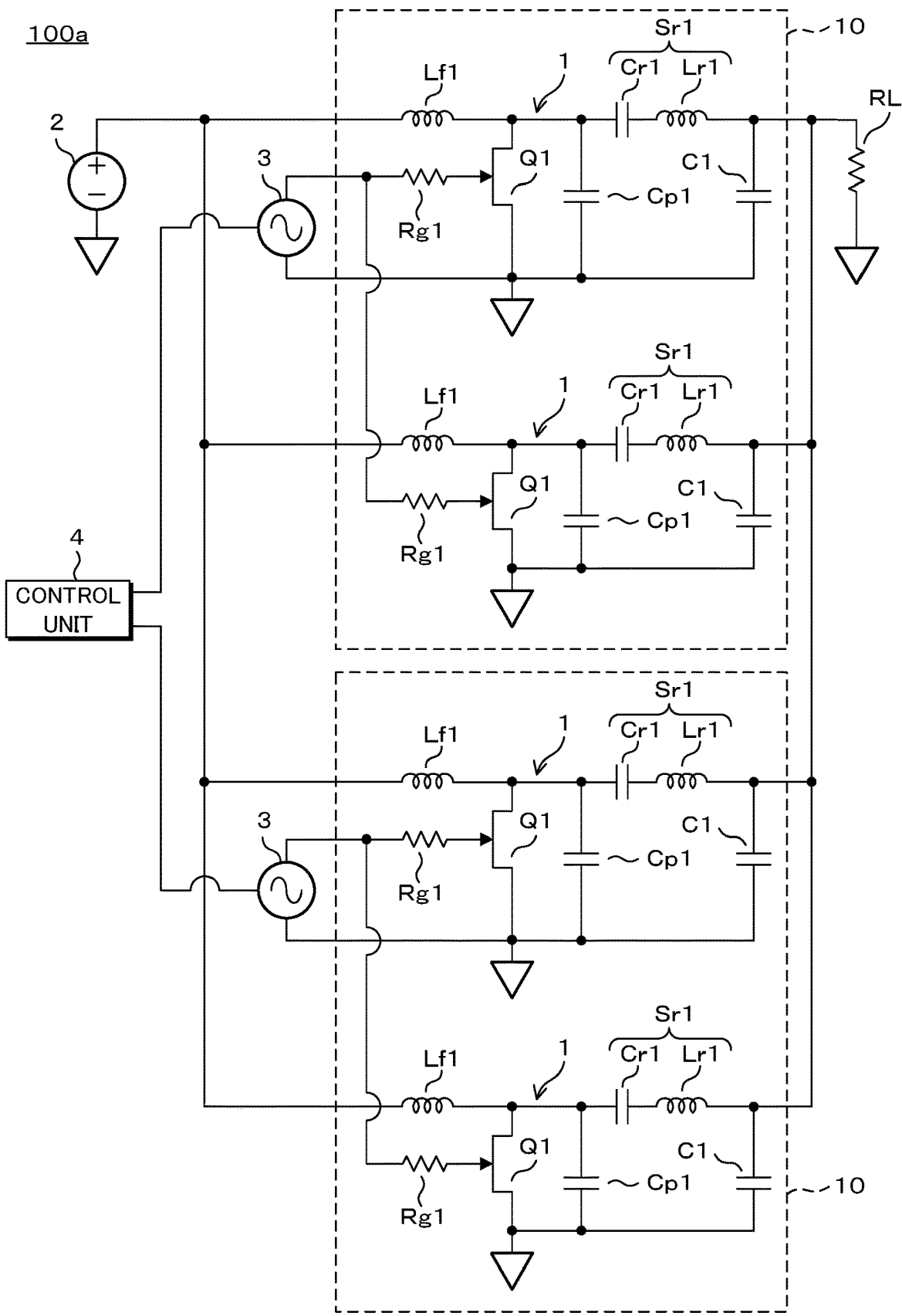
FIG. 4 is a block diagram illustrating an example of the configuration of a high-frequency power supply circuit according to Embodiment 2.

FIG. 4 is a block diagram illustrating an example of the configuration of the high-frequency power supply circuit 100a according to Embodiment 2. The high-frequency power supply circuit 100a includes two assembled circuits 10. Each assembled circuit 10 includes two amplifier circuits 1. In each of the two amplifier circuits 1 included in each assembled circuit 10, one end of the inductor Lf1 is connected to the direct-current power supply 2. In each assembled circuit 10, a high-frequency signal having 40.68 MHz is input from a common signal generator 3 to the two amplifier circuits 1 through the resistors Rg1. The other ends of the LC series circuits Sr1 of the four amplifier circuits 1 included in the two assembled circuits 10 are connected to each other. The other ends of the LC series circuits Sr1 are connected to one end of the load RL. The other end of the load RL is connected to the common potential. The circuit constants of the inductor Lf1, the capacitor Cp1, the inductor Lr1, the capacitor Cr1, and the capacitor C1 are the same as the values determined and adjusted in Embodiment 1. In Embodiment 2, the resistance value of the load RL is 5 Ω.

The two signal generators 3 are connected to a control unit 4. The direct-current power supply 2 is a constant voltage power supply. The direct-current power supply 2 outputs a direct-current voltage of 70 V and supplies a direct current from one end of each of four inductors Lf1. It is noted that the output voltage of the direct-current power supply 2 is not limited to 70 V. In addition, portions corresponding to those in Embodiment 1 are denoted by the same reference numerals and the description of the configuration thereof will be omitted.

The control unit 4 has a central processing unit (CPU) (not illustrated). The control unit 4 controls a phase difference between the signals generated by the two signal generators 3 according to a control program stored in a read only memory (ROM) in advance. The temporarily generated information is stored in a random access memory (RAM). The control unit 4 and the two signal generators 3 may be integrally configured.

In the configuration illustrated in FIG. 4, the currents output by the two amplifier circuits 1 included in each assembled circuit 10 are added in the same phase. The two currents are added and supplied to the load RL. The currents output by the two amplifier circuits 1 included in one assembled circuit 10 and the currents output by the two amplifier circuits 1 included in the other assembled circuit 10 are added according to the phase difference between the signals generated by the two signal generators 3. The added current is supplied to the load RL.

Figure 5A:
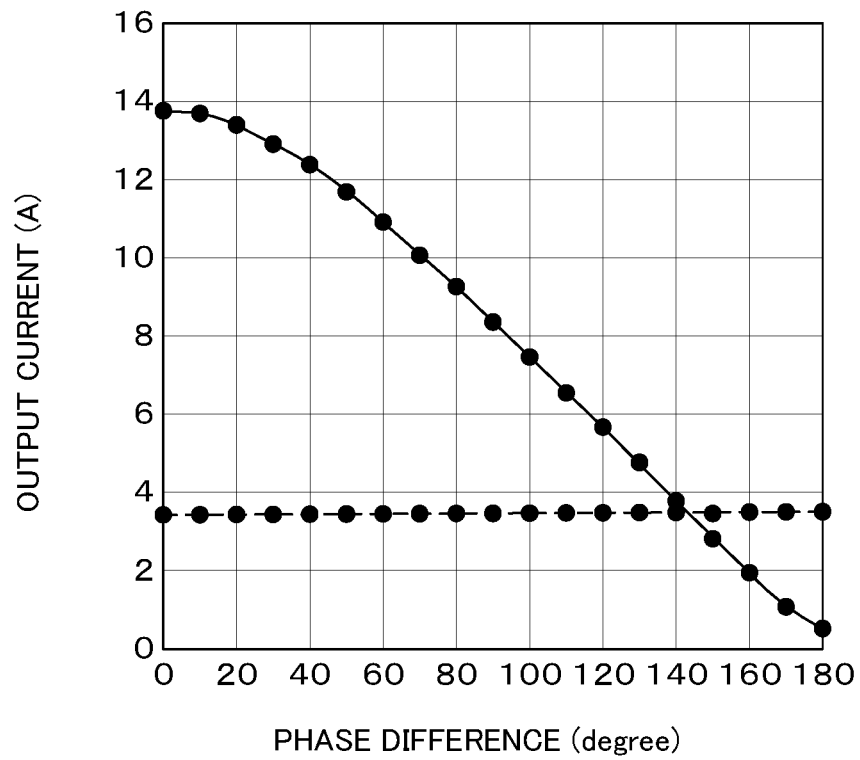
FIG. 5A is a graph showing output characteristics corresponding to a phase difference between signals input to the high-frequency power supply circuit.
Figure 5B:
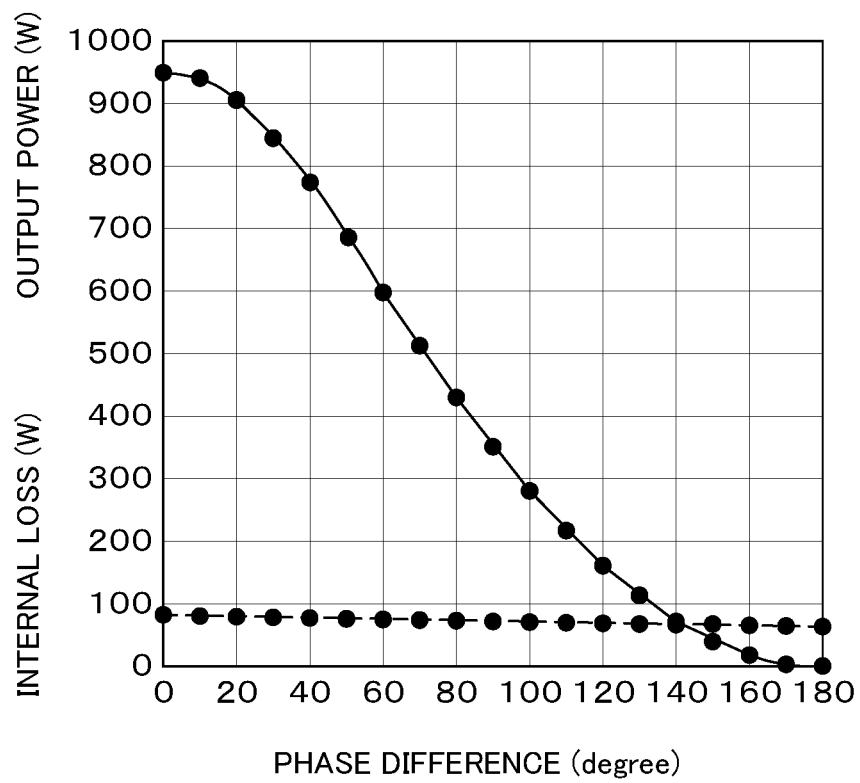
FIG. 5B is a graph showing the output characteristics corresponding to the phase difference between the signals input to the high-frequency power supply circuit.

FIGS. 5A and 5B are graphs showing output characteristics corresponding to the phase difference between the signals input to the high-frequency power supply circuit 100a. FIG. 5A shows the relationship between the phase difference between the signals generated by the two signal generators 3 and the current output from the high-frequency power supply circuit 100a to the load RL. In addition, FIG. 5A shows the relationship between the phase difference between the signals generated by the two signal generators 3 and the current output from each amplifier circuit 1 to the load RL. FIG. 5B shows the relationship between the phase difference between the signals generated by the two signal generators 3 and the power output from the high-frequency power supply circuit 100a to the load RL. In addition, FIG. 5B shows the relationship between the phase difference between the signals generated by the two signal generators 3 and the internal loss of the high-frequency power supply circuit 100a. In FIGS. 5A and 5B, the horizontal axis indicates the phase difference (degree). In FIG. 5A, the vertical axis indicates the output current (A). In FIG. 5B, the vertical axis indicates the output power (W) and the internal loss (W). Here, the resistance value of the load RL is 5 Ω.

In FIG. 5A, a solid line indicates the current output from the high-frequency power supply circuit 100a to the load RL. In FIG. 5A, a dashed line indicates the current output from each amplifier circuit 1 to the load RL. The current output from each amplifier circuit 1 to the load RL is stable at about 3.5 A. However, for the current output from the high-frequency power supply circuit 100a to the load RL, in a case in which the phase difference between the signals generated by the two signal generators 3 is changed from 0 degrees to 180 degrees, the output current is monotonically decreased from 13.8 A to 0.5 A. In particular, in a case in which there is no phase difference between the signals generated by the two signal generators 3, the currents output by the four amplifier circuits 1 are added in the same phase in the load RL. Therefore, the graphs show that, in a case in which there is no phase difference, the current supplied to the load RL is approximately four times larger than the current output from one amplifier circuit 1. As such, the magnitude of the current output from the high-frequency power supply circuit 100a to the load RL can be arbitrarily changed according to the phase difference between the signals generated by the two signal generators 3.

In FIG. 5B, a solid line indicates the power output from the high-frequency power supply circuit 100a to the load RL. In FIG. 5B, a dashed line indicates the internal loss of the high-frequency power supply circuit 100a. The internal loss is calculated by subtracting the power output by the high-frequency power supply circuit 100a from the power output by the direct-current power supply 2. In a case in which the phase difference between the signals generated by the two signal generators 3 is within the range of 0 degrees to 180 degrees, the internal loss falls within the range of 90 W to 70 W. Therefore, it can be said that the internal loss is not increased by the phase difference of the added currents. It is shown that the output power is approximately proportional to the square of the output current shown in FIG. 5A.

Figure 6A:
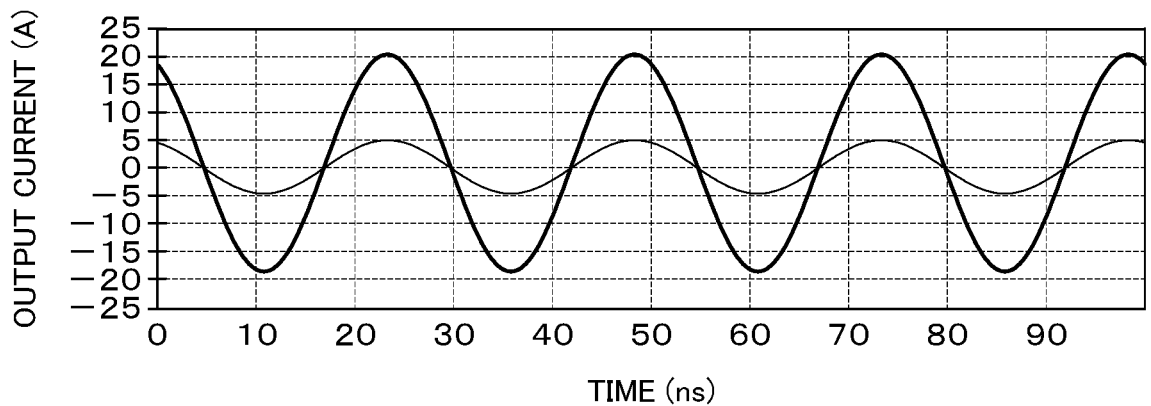
FIG. 6A is a graph showing the waveforms of output currents of each amplifier circuit and the high-frequency power supply circuit.
Figure 6B:
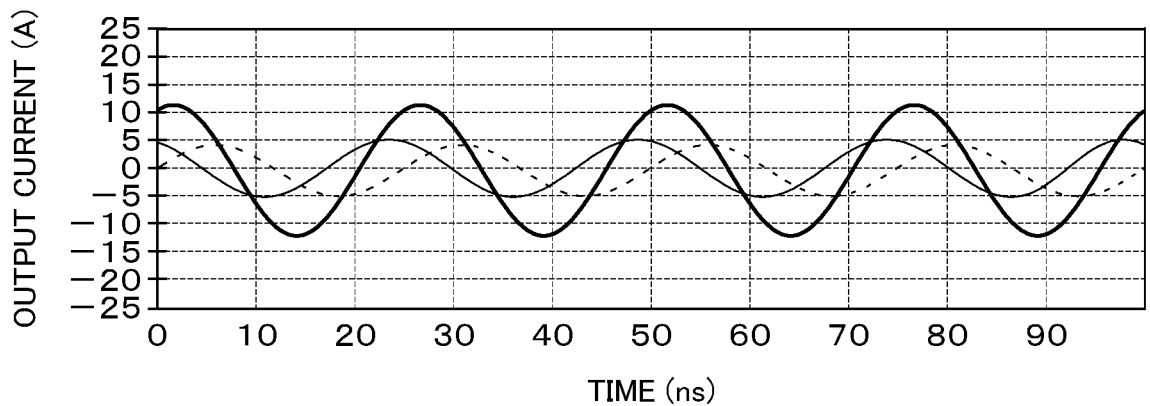
FIG. 6B is a graph showing the waveforms of the output currents of each amplifier circuit and the high-frequency power supply circuit.
Figure 6C:
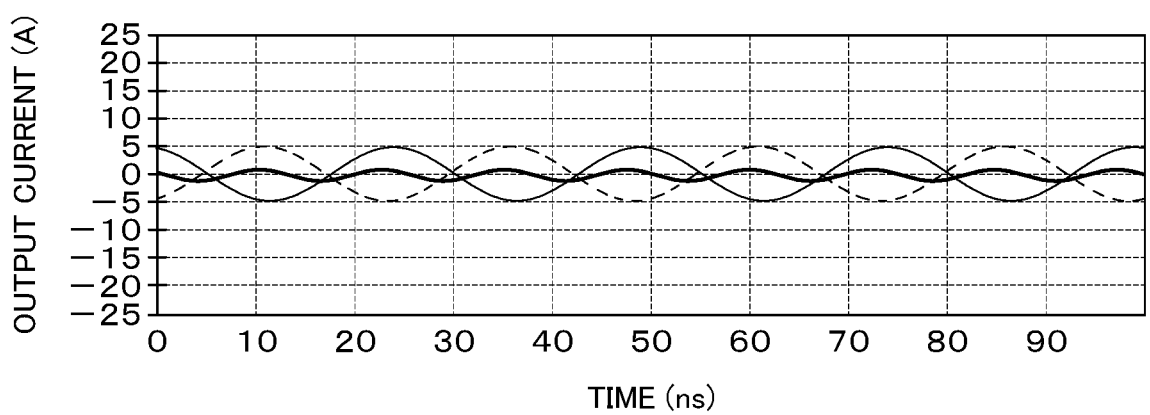
FIG. 6C is a graph showing the waveforms of the output currents of each amplifier circuit and the high-frequency power supply circuit.

FIGS. 6A, 6B and 6C are graphs showing the waveforms of the output currents of each amplifier circuit 1 and the high-frequency power supply circuit 100a. FIGS. 6A, 6B and 6C show the waveforms of the output currents in cases in which the phase differences between the signals generated by the two signal generators 3 are 0 degrees, 90 degrees, and 180 degrees, respectively. In FIGS. 6A, 6B and 6C, the horizontal axis indicates time (ns) and the vertical axis indicates the output current (A). In FIGS. 6A, 6B, and 6C, a solid line indicates the output current of the high-frequency power supply circuit 100a. A thin solid line indicates the output current of each of the two amplifier circuits 1 included in one assembled circuit 10. A thin dashed line indicates the output current of each of the two amplifier circuits 1 included in the other assembled circuit 10. However, in FIG. 6A, the output currents of all of the amplifier circuits 1 overlap each other. These output currents are indicated by thin solid lines. Further, in FIGS. 6B and 6C, the output currents of the two amplifier circuits 1 included in one assembled circuit 10 overlap each other. These output currents are indicated by thin solid lines. Furthermore, the output currents of the two amplifier circuits 1 included in the other assembled circuit 10 overlap each other. These output currents are indicated by thin dashed lines.

As can be seen from FIG. 6A, the magnitude of the output current from the high-frequency power supply circuit 100*a* is four times larger than the magnitude of the output current of each of the four amplifier circuits 1 at any time. As can be seen from FIG. 6B, an output current obtained by adding two currents is output from the high-frequency power supply circuit 100*a* at any time. One of the two currents is a current, magnitude of which is twice larger than the magnitude of the output current of the amplifier circuit 1 corresponding to the thin solid line. The other current is a current, magnitude of which is twice larger than the magnitude of the output current of the amplifier circuit 1 corresponding to the thin dashed line. As can be seen from FIG. 6C, an output current obtained by adding two currents so as to cancel each other is output from the high-frequency power supply circuit 100*a* at any time. One of the two currents is a current, magnitude of which is twice larger than the magnitude of the output current of the amplifier circuit 1 corresponding to the thin solid line. The other current is a current, magnitude of which is twice larger than the magnitude of the output current of the amplifier circuit 1 corresponding to the thin dashed line.

FIGS. 5A and 5B show static characteristics. FIGS. 6A, 6B, and 6C show steady waveforms. In a case in which the high-frequency power supply circuit 100*a* is actually used, the phase difference between the signals generated by the two signal generators 3 is likely to change in a relatively short cycle. For example, it has been confirmed that the envelope of the high-frequency current output from the high-frequency power supply circuit 100*a* changes stepwise in a cycle of 1 μs even in a case in which the phase difference between the signals generated by the two signal generators 3 changes to 0 degrees and 120 degrees in a cycle of 1 μs (not illustrated).

As described above, according to Embodiment 2, each assembled circuit 10 has one or a plurality of amplifier circuits 1. Further, the output ends of all of the amplifier circuits 1 are connected in order to put two assembled circuits 10 together. Therefore, each assembled circuit 10 can add the currents output by one or a plurality of amplifier circuits 1. Further, it is possible to further add the currents output by a plurality of assembled circuits 10.

In addition, according to Embodiment 2, each assembled circuit 10 has one or a plurality of amplifier circuits 1. The signal generator 3 is independently provided for each assembled circuit 10. Each signal generator 3 inputs a signal having a unique frequency to the control terminal of one or a plurality of amplifier circuits 1 included in the corresponding assembled circuit 10. The phase difference between the signals generated by the plurality of signal generators 3 is variably controlled. Therefore, a current, amplitude of which is variably adjusted according to the phase difference can be output from the high-frequency power supply circuit 100*a* in which the assembled circuits 10 are connected to each other.

Modification Example 1

In Embodiment 2, four capacitors C1 included in four amplifier circuits 1 are connected in parallel to each other. In Modification Example 1, one capacitor C2 is used as the four capacitors C1.

Figure 7:
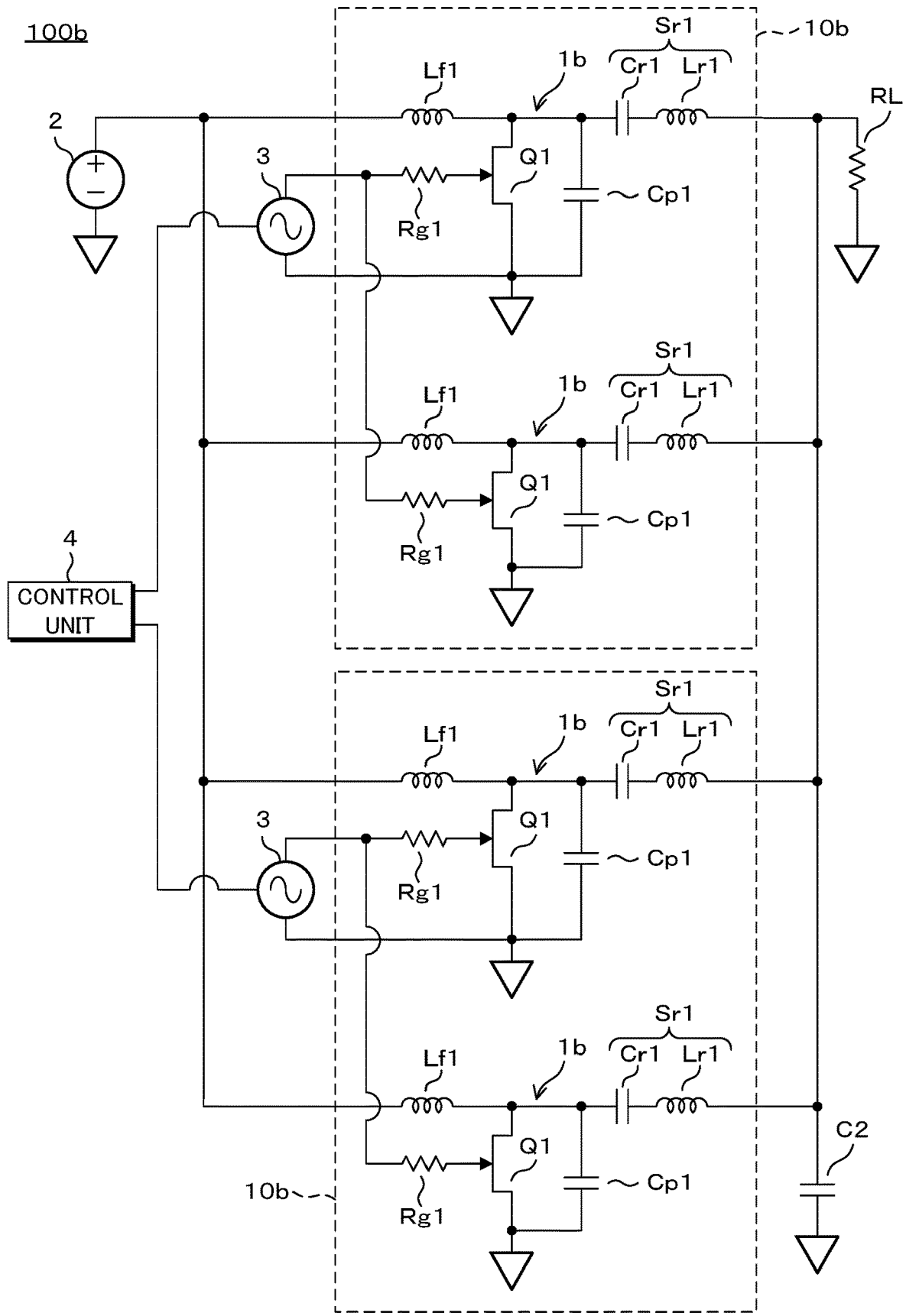
FIG. 7 is a block diagram illustrating an example of the configuration of a high-frequency power supply circuit according to Modification Example 1.

FIG. 7 is a block diagram illustrating an example of the configuration of a high-frequency power supply circuit 100*b* according to Modification Example 1. The high-frequency power supply circuit 100*b* includes two assembled circuits 10*b*. Each assembled circuit 10*b* includes two amplifier circuits 1*b*. The configuration of the amplifier circuit 1*b* is obtained by removing the capacitor C1 from the configuration of the amplifier circuit 1 according to Embodiments 1 and 2. For four amplifier circuits 1*b* included in the two assembled circuits 10*b*, the other ends of the LC series circuits Sr1 are connected to each other. The other end of each LC series circuit Sr1 is connected to one end of the load RL. The capacitor C2 is connected between the common potential and a connection point among the other ends of four LC series circuits Sr1 and the load RL. In addition, portions corresponding to those in Embodiments 1 and 2 are denoted by the same reference numerals and the description of the configuration thereof will be omitted.

The circuit constants of the inductor Lf1, the capacitor Cp1, the inductor Lr1, and the capacitor Cr1 are the same as the values determined and adjusted in Embodiment 1. The capacitance of the capacitor C2 includes the capacitance of the four capacitors C1 determined and adjusted in Embodiment 1. Specifically, in a case in which the capacitance of the capacitor C1 is 163 pF, a capacitor having a capacitance of 654 pF is used as the capacitor C2, for example.

The high-frequency power supply circuit 100*b* according to Modification Example 1 is achieved only by replacing the four capacitors C1 regarded as four lumped constants with the capacitor C2 which is one lumped constant, as compared to the high-frequency power supply circuit 100*a*. Therefore, the high-frequency power supply circuit 100*b* according to Modification Example 1 has the same operation and effect as the high-frequency power supply circuit 100*a* according to Embodiment 2.

It is noted that, as used herein and in the appended claims, the singular forms "a", "an", and "the" include plural referents unless the context clearly dictates otherwise.

The disclosed embodiments are to be considered as illustrative in all points and not restrictive. The scope of the invention is shown not by the above-mentioned meanings but by the claims, and is intended to include meanings equivalent to the claims and all modifications within the scope. Further, the technical features described in each embodiment can be combined with each other.

What is claimed is:

1. A high-frequency power supply circuit comprising:
an amplifier circuit and two assembled circuits,
wherein the amplifier circuit includes:
an inductor that has one end connected to a direct-current power supply;
a switching element that has one end connected to the other end of the inductor;
a parallel capacitor that is connected in parallel to the switching element;
an LC series circuit that has one end connected to the one end of the switching element; and
a circuit capacitor that is connected between the other end of the LC series circuit and the other end of the switching element,
the amplifier circuit amplifies a signal which has a unique frequency and which is input to a control terminal of the switching element,
the amplifier circuit outputs, to a load, a current having the unique frequency from a connection point between the other end of the LC series circuit and the circuit capacitor,
each assembled circuit includes one or a plurality of the amplifier circuits, and
the other ends of a plurality of the LC series circuits included in the two assembled circuits are connected to each other.

2. The high-frequency power supply circuit according to claim 1,
wherein an absolute value of first impedance of a case in which the amplifier circuit side is viewed from the load is greater than impedance of the load when the switching element is ON, the first impedance being related to the unique frequency.

3. The high-frequency power supply circuit according to claim 1,
wherein a reactance component of second impedance of a case in which the load side is viewed from the one end of the LC series circuit is inductive, the second impedance being related to the unique frequency.

4. A determining method of constants of an amplifier circuit including: a first inductor; a switching element that has one end connected to one end of the first inductor; a first capacitor that is connected in parallel to the switching element; an LC series circuit that has one end connected to the one end of the switching element and includes a second capacitor and a second inductor; and a third capacitor that is connected between the other end of the LC series circuit and the other end of the switching element, the determining method comprising:

determining inductance of the first and second inductors and capacitance of the first and second capacitors such that a circuit excluding the third capacitor becomes a class-E amplifier circuit that amplifies a signal having a unique frequency;

adjusting the determined inductance of the second inductor to a larger value such that a resistance component of impedance of a case in which the amplifier circuit side is viewed from a connection point between the other end of the LC series circuit and the third capacitor approaches infinity and a reactance component of the impedance approaches 0 when the switching element is ON in a circuit including the third capacitor, the impedance being related to the unique frequency; and adjusting the capacitance of the third capacitor such that the resistance component approaches infinity and the reactance component approaches 0 when the switching element is ON in the circuit including the third capacitor.

5. The high-frequency power supply circuit according to claim 1, further comprising:

two signal generators that correspond to the two assembled circuits, respectively, wherein each signal generator inputs the signal having the unique frequency to the control terminal of the switching element included in the amplifier circuit of the corresponding assembled circuit, and a phase difference between the signals output by the two signal generators is variable.

* * * * *